United States Patent [19]

Black

[11] Patent Number: 5,220,290

[45] Date of Patent: Jun. 15, 1993

[54] POWER AMPLIFIER

[75] Inventor: Gregory R. Black, Vernon Hills, Ill.

[73] Assignee: Motorola, Inc., Schaumburg, Ill.

[21] Appl. No.: 886,565

[22] Filed: May 21, 1992

Related U.S. Application Data

[62] Division of Ser. No. 709,733, Jun. 3, 1991, Pat. No. 5,160,898.

[51] Int. Cl.$^5$ ............................................. H03G 3/30
[52] U.S. Cl. .................................. 330/279; 330/133;
455/116
[58] Field of Search ...................... 330/133, 279, 285;
455/116, 127, 126

[56] References Cited

U.S. PATENT DOCUMENTS

| | | | |
|---|---|---|---|
| 3,003,115 | 10/1961 | Stull, Jr. ................................ | 330/133 |
| 3,449,686 | 6/1969 | Bladen ............................ | 330/285 X |
| 3,512,096 | 5/1970 | Nagata et al. . | |
| 3,553,601 | 1/1971 | Glasser . | |
| 3,560,995 | 2/1971 | Zielinski et al. . | |
| 4,225,827 | 9/1980 | Davis, Jr. ............................. | 330/256 |
| 4,367,443 | 1/1983 | Hull et al. ....................... | 330/207 P |
| 4,510,460 | 4/1985 | Tamura ................................ | 330/285 |
| 4,935,705 | 6/1990 | Estanislao et al. ............. | 330/285 X |
| 4,992,753 | 2/1991 | Jenson et al. ....................... | 330/129 |
| 5,029,298 | 7/1991 | Chiba et al. .......................... | 330/285 |

FOREIGN PATENT DOCUMENTS 53-144235 12/1978 Japan .

OTHER PUBLICATIONS

RCA Technical Notes, A Publication of RCA Princeton, N.J., TN No.: 1258, Sep. 11, 1980, pp. 1–3.

*Primary Examiner*—James B. Mullins
*Attorney, Agent, or Firm*—Kirk W. Dailey; Rolland R. Hackbart

[57] ABSTRACT

An amplifier which contains two amplifier stages. Each amplifier stage (433,435) utilizes a diode (407) to attenuate the RF input signal (401) and to stabilize the bias current over temperature. The two amplifier stages (433, 435) are cascaded together. The control voltage inputs are serially coupled through a transistor (423). The transistor (423) shifts the voltage of the control signal (425) down, thereby, shifting the control characteristics and AM characteristics of the first amplifier stage (435) relative to the second amplifier stage (433).

7 Claims, 4 Drawing Sheets

| POWER LEVEL | MAXIMUM LEVEL MEASURED | | | |
|---|---|---|---|---|
| | 400kHz | 600kHz | 1200kHz | 1800kHz |
| 43 dbm | −17 dbm | −26 dbm | −32 dbm | −36 dbm |
| 41 dbm | −19 dbm | −26 dbm | −32 dbm | −36 dbm |
| 39 dbm | −21 dbm | −26 dbm | −32 dbm | −36 dbm |
| <37 dbm | −23 dbm | −26 dbm | −32 dbm | −36 dbm |

POWER AMPLIFIER

This is a division of application Ser. No. 07/709,733, filed Jun. 3, 1991 now U.S. Pat. No. 5,160,898.

FIELD OF THE INVENTION

This invention generally relates to power amplifiers, and more specifically to improvements in the power control range and Amplitude Modulated (AM) output of the power amplifier.

BACKGROUND OF THE INVENTION

The use of power amplifiers for transmitting radio frequency signals has many applications, including, but not limited to, radiotelephone communications systems. When using a power amplifier in a radiotelephone certain qualities of the power amplifier are desirable including: 1) a large power control range, 2) temperature stability, 3) efficient use of current, and 4) minimal AM output.

A total power control range is limited on the high end by the gain of the amplifier at the maximum bias current and the power control range is limited on the low end by the isolation of the amplifier from the radio frequency (RF) input when the bias current is zero. Within this range, the output power is approximately proportional to the square of the bias current.

Typically, in order to obtain maximum gain and efficiency for a given bias current, class C amplifiers are used. In previous class C amplifier configurations, the isolation from the RF input, in absence of bias current, was limited to the parasitic capacitance between the collector and the base of the transistor.

In order to obtain the desired temperature stability in low efficiency amplifiers, a resistor is coupled between the emitter of the transistor contained within the amplifier to ground. This resistor stabilizes the amplifier over temperature, however, it is undesirable because it lowers the efficiency of the amplifier. In order to obtain high efficiency of the amplifier, the collector and emitter must be void of any lossy resistive elements. Removal of these lossy elements increases the potential gain and efficiency of the amplifier, however, it causes the amplifier circuit to be extremely temperature sensitive, unless other bias stabilization measures are employed.

FIG. 3 illustrates a commonly employed circuit topology for RF power amplifiers. The focus of the circuit is the bipolar transistor 309 in a common emitter configuration. This circuit attempts to attain bias control and temperature stability by using the clamping diode 305. The intrinsic characteristics of this clamping diode 305 are matched to the base emitter junction of the transistor 309. The diode voltage tends to track the base to emitter voltage of the transistor 309 resulting in a temperature stable bias current which is approximately proportional to the control voltage 301. The clamping diode 305 also serves as a circuit protector from excessive control voltage 301.

The amplifier of FIG. 3 would have a typical control characteristic and AM characteristic as illustrated in FIG. 5. The control characteristic is a plot of the RF output power 501 over the control voltage range 301. The AM characteristic is a plot of percentage AM output 503 for one percent AM input on the RF input signal over the control voltage range 301. The peak of the AM characteristic 503 tends to be aligned with the steep portion of the control characteristic 501. The steep portion may also be defined as the point of maximum slope.

If two amplifiers as shown in FIG. 3 are cascaded and the control voltage inputs are tied directly together, then the composite control characteristic would have approximately twice the slope of the individual control characteristic 501. The magnitude of the AM characteristic would be approximately double the individual AM characteristic 503. The increased AM characteristic is undesirable, because the AM modulation would result in power fluctuations on the RF output signal 313.

The lossy elements were not present in this circuit, thus, allowing for a maximum potential gain and efficiency of the amplifier. However, the isolation of the RF signal from the amplifier in absence of bias current is dependent on the parasitic capacitance of the transistor 309. Thus, the power control range is not maximized.

Therefore, there is a need for a temperature stable, power efficient RF power amplifier having a large power control range, and minimal AM output.

SUMMARY OF THE INVENTION

The present invention encompasses an amplifier which includes a first input signal, a first output signal, a bias current and a control voltage. The first signal carries a first radio frequency signal. The first output signal carries an amplified first radio frequency signal. Variances in the bias current are responsive to variances in the control voltage. The amplifier has means for amplifying the first input signal. The amplifier also has means for stabilizing the bias current responsive to changes in temperature and means for attenuating the first radio frequency signal responsive to changes in the control voltage contained within the same element.

DESCRIPTION OF A PREFERRED EMBODIMENT

Figure 1:
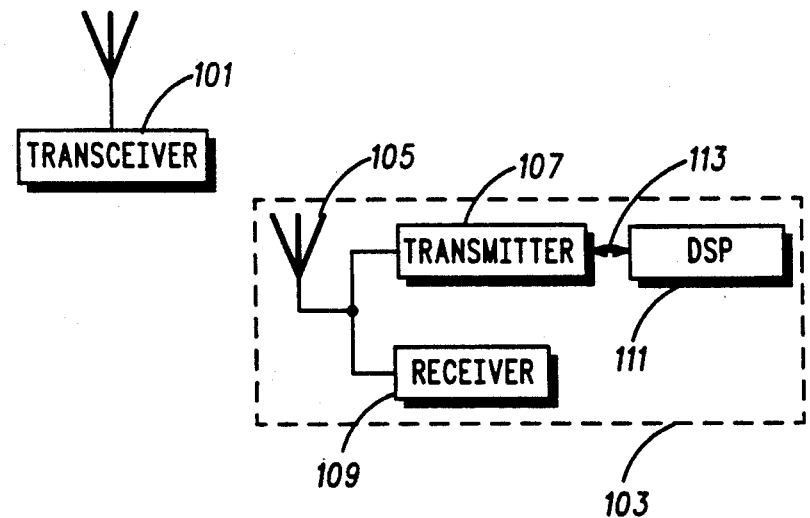
FIG. 1 is a block diagram of a radiotelephone communications system which may employ the present invention.

The invention disclosed herein, may be employed in a TDMA radiotelephone system which is illustrated in FIG. 1. In a radiotelephone system there is a fixed site transceiver 101, which sends out RF signals to portable and mobile radiotelephones contained within a geographic coverage area. One such phone is the portable radiotelephone 103. A radiotelephone system is assigned a frequency band which it is allowed to broadcast within. The frequency band is broken up into several channels 200 Kilohertz wide. Each channel is capable of handling communications between the transceiver 101 and up to 8 radiotelephones within its coverage area. Each radiotelephone is assigned time slots in which to broadcast and receive information from the transceiver 101. Each time slot is approximately 577 microseconds in duration. Portable radiotelephone 103, model number F19UVD0960AA available from Motorola, Inc., includes a transmitter 107, a receiver 109, and a digital signal processor (DSP) 111, such as the DSP 56000 available from Motorola, Inc. Several signals are transmitted between the DSP 111 and the transmitter 107 on multiple signal lines 113.

Figures 7, 8:
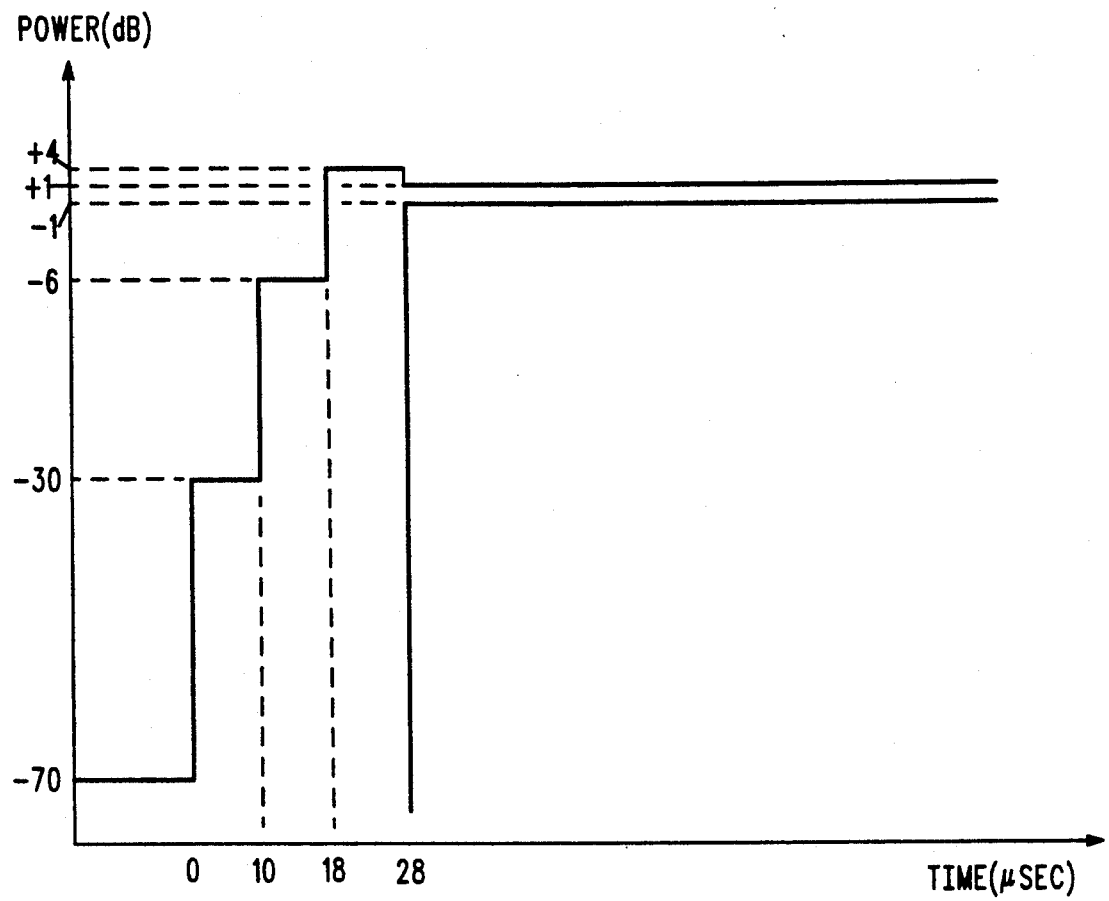
FIG. 7 is the GSM time mask as defined by GSM recommendation 05.05 (4.2.2).
FIG. 8 is the GSM spectral frequency mask as defined by GSM recommendation 05.05 (4.5.2).

The transmitter 107 and the transceiver 101 both contain power amplifiers with stringent requirements as defined by the Group Special Mobile (GSM) recommendations ETSI/PT-12 05.05 (4.2.2 and 4.5.2), March, 1991. The specifications require any transmitter to meet a time mask as shown in FIG. 7 and a spectral frequency mask as shown in FIG. 8.

The antenna 105 is used to transmit and receive radio frequency signals to and from transceiver 101. Upon receiving signals, the antenna 105 converts the signals into electrical radio frequency signals and transfers the signals to the receiver 109. The receiver 109 demodulates and converts electrical radio frequency signals into data signals usable by the rest of the portable radiotelephone 103.

Upon transmission of the radio frequency signals, the DSP 111 feeds the transmitter 107 information which is desired to be transmitted and also controlling information for the transmitter 107 via signal lines 113. The transmitter 107 takes the data and converts it into electrical radio frequency signals and gives the electrical radio frequency signals the appropriate amount of power necessary with use of the power amplifier. The antenna 105 then takes the electrical radio frequency signals and converts them into radio frequency signals and transmits them into the air for use by the transceiver 101.

Figure 2:
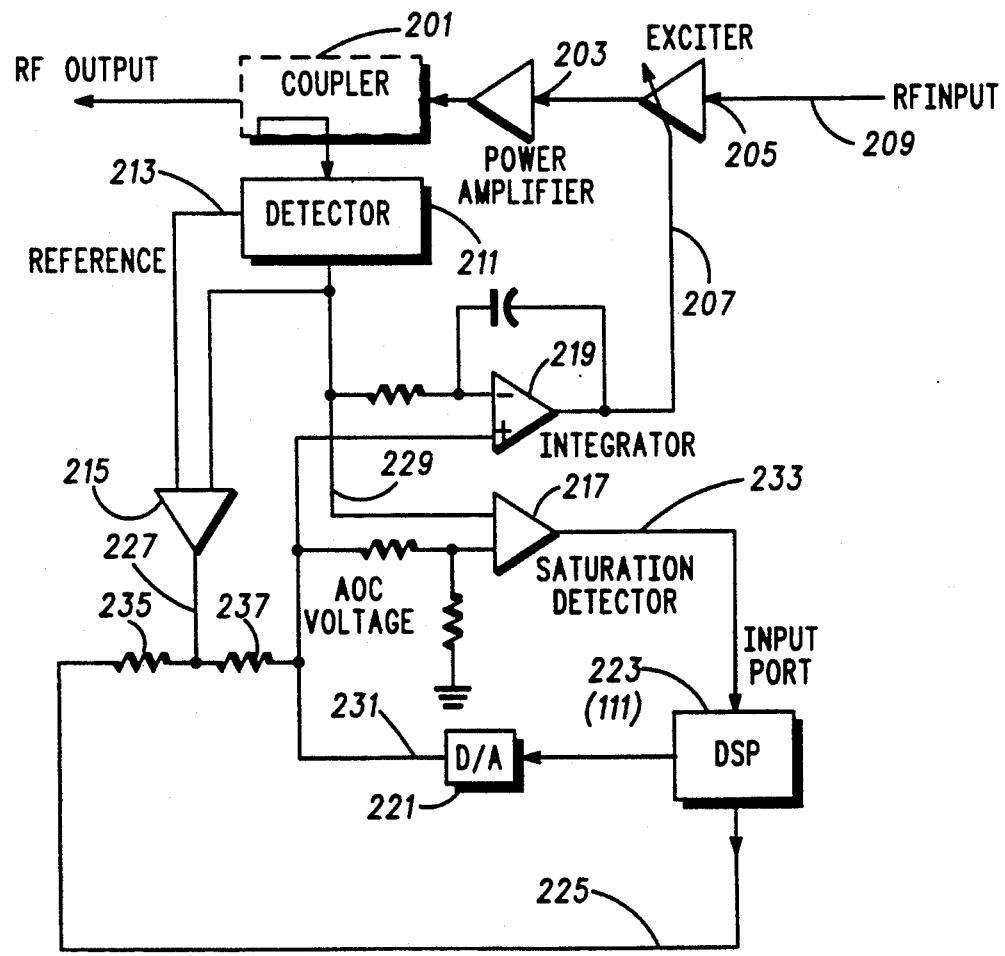
FIG. 2 is a block diagram of a power amplifier and corresponding power amplifier control circuitry which may employ the present invention.
Figure 3:
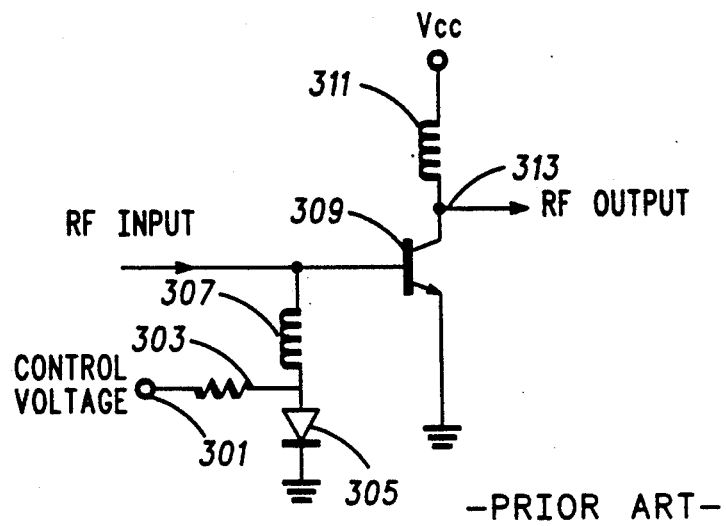
FIG. 3 is a power amplifier control circuit which is contained in the prior art.

The power amplifier 203 and its associated controllers are located in the transmitter 107, and illustrated in the block diagram of FIG. 2. The function of the power amplifier 203 is to take in the radio frequency input which contains voice and data which is to be transmitted back to the fixed site transceiver 101 and amplify the RF input signals 209 to the appropriate power level for transmission. The exciter 205 is an adjustable power amplifier which adjusts the RF input signals 209 to their proper input level for the power amplifier 203.

The block diagram of FIG. 2 contains several control loops, including the standard control loop, the ramp up loop, and the saturation detector loop of the power amplifiers. The details of the power ramp up loop may be found in U.S. Pat. No. 5,150,075 Ser. No. 07/709,738 Jun. 3, 1991 assigned to the assignee of the present invention. The details of the saturation detector loop may be found in U.S. patent application Ser. No. 07/709,737 "Power Amplifier Saturation Detection and Correction Method and Apparatus", filed on behalf of Black et al., on Jun. 3, 1991 assigned to the assignee of the present invention.

Figure 4:
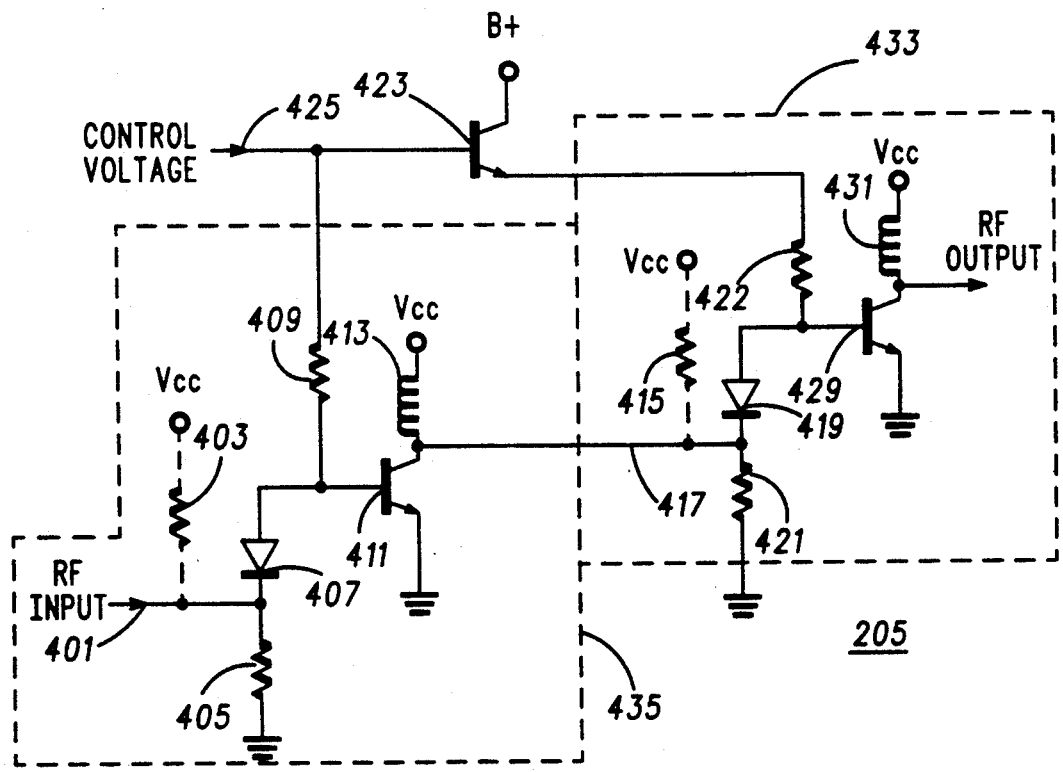
FIG. 4 is a two-stage power amplifier circuit which may employ the present invention.
Figure 5:
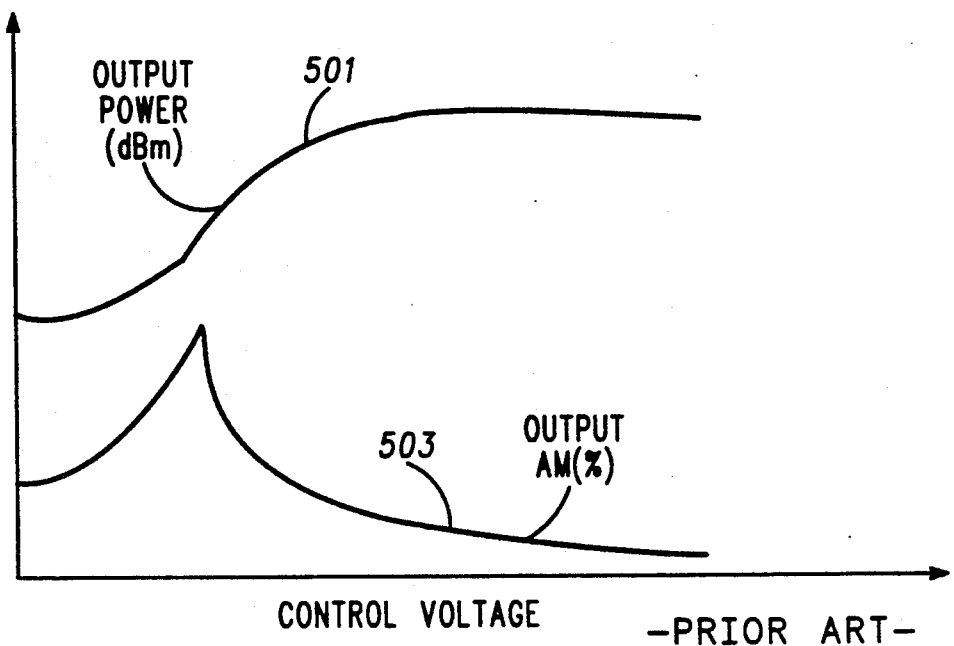
FIG. 5 is a control characteristic and an AM characteristic of a power amplifier which may be contained in prior art.

The circuit in FIG. 4 is a two-stage power amplifier with variable gain used as the exciter 205. The first stage of amplification 435 includes: the transistor 411, the diode 407, the inductor 413, the resistors 403, 405, 409.

The second amplification stage 433 includes: the transistor 429, the diode 419, the inductor 431, the resistors 415, 421, 422. The two amplification stages are directly coupled together via signal line 417.

Figure 6:
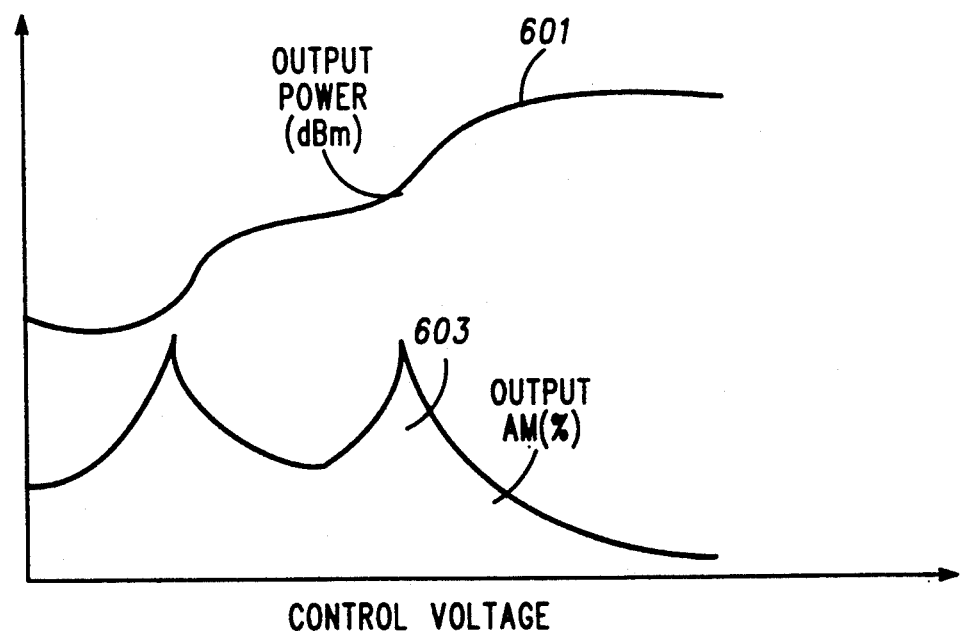
FIG. 6 is a control characteristic and an AM characteristic of a power amplifier which may be a result of the present invention.

The control voltage 425 is used to control the bias current in both amplification stages 433,435. The control voltage is serialized such that it can control the gain of both amplifier stages 433,435 simultaneously. The transistor 423 is located on the control voltage line 425 between the two amplification stages. The purpose of the transistor 423 is to shift the voltage of the control voltage signal 425, separating the control characteristic of the first amplification stage relative to the second amplification stage, resulting in a control characteristic 601 of FIG. 6. Other equally efficient ways of shifting the voltage are available including diodes or voltage divider circuits. The difference in the control voltage 425 for the amplification stages 433,435 is also used to separate the two power amplifier stages 433,435 from the region in the AM characteristic which contains highest AM output. In the preferred embodiment, the circuit illustrated in FIG. 4 had AM output less than 2% over the entire power output range for 1% of AM input on the RF input signal 401. This results in an AM characteristic resembling the waveform 603 in FIG. 6. Without the shifting of the control voltage signal 425, the magnitude of the AM characteristic would be approximately twice as large at the peak. This would potentially violate the maximum power output required in the GSM spectral time mask illustrated in FIG. 7.

The transistors 411 and 429 are set up for high power efficiency. The emitter and collector of the transistors are void of any lossy elements, allowing for maximum efficiency. The emitter of both transistors 411 and 429 are tied directly to electrical ground, and the collectors are tied to a supply voltage through inductor 413 and inductor 431 respectively. The inductors 413, 431 serve as an RF load for the amplifier. Connecting the emitters directly to ground prevents any unnecessary loss of amplification, but leaves the amplifier temperature unstable.

The diodes 407, 419 stabilize the bias current over temperature, isolate the amplifier from the RF input signal 401 in absence of a control voltage 425 and provide circuit protection from excessive control voltage 425. First, the diode serves as a bias stabilizer. By matching the diode 407 with the base emitter characteristics of transistor 411, the bias current through the transistor will be stable over temperature for a given control voltage 425, as long as resistor 405 remains small. Secondly, the diode 407 acts to isolate the RF input signal 401 from the transistor 411 in absence of a control voltage 425. As the control voltage increases the conductivity of diode 407 increases, thus, the RF input signal is unattenuated while there is an active control voltage and current flowing through diode 407. In the absence of the control voltage 425, the conductivity of diode 407 is low, isolating the RF input signal 401 from the remainder of the amplifier circuitry. Therefore, the amplifier stage has high input to output isolation in the absence of a control voltage giving the amplifier stage a larger power control range. Third, the diode 407 acts as a protector against excessive control voltage signals.

Resistor 405 serves as a DC return element to the diode 407 and as a RF blocking element. Its value should be chosen to match the emitter ballasting voltage drop internal to the transistor 411. The pull-up resistor 403 is used to provide reverse bias current on the diode in absence of control voltage 425, thereby, further decreasing the conductance of diode 407 and increasing the attenuation of the RF input signal 401. This resistor 403 is optional, not necessary to have a successful amplifier circuit.

The two amplification stages are DC coupled together allowing for maximum power from the first amplifier stage to be coupled into the second amplifier stage.

Thus, the circuit illustrated in FIG. 4 is a temperature stable, power efficient RF amplifier design with a large power control range and improved AM output.

What is claimed is:

1. A transmitter having amplitude modulated (AM) gain and a control characteristic and including at least a first and a second means for amplifying, the first and the second means for amplifying each having a first signal input and a control signal input, a first signal output, and a control characteristic responsive to the control signal input and having a point of maximum slope, the transmitter comprising:
    means for coupling the first means for amplifying and the second means for amplifying;
    a first control signal having a voltage and coupled to the control signal input of the first means for amplifying; and
    means for shifting voltage having an input and an output, said input of said means for shifting coupled to said first control signal, said output of said means for shifting coupled to the control signal input of the second means for amplifying, such that the point of maximum slope of the control characteristic of the first means for amplifying is shifted from the point of maximum slope of the control characteristic of the second means for amplifying, thereby substantially limiting the maximum slope of the transmitter control characteristic and the transmitter AM gain.

2. A transmitter in accordance with claim 1 wherein the first input of the first and the second means for amplifying further comprises a radio frequency (RF) input.

3. A transmitter in accordance with claim 1 wherein the control signal input of the first and the second means for amplifying further comprises a control voltage input.

4. A transmitter in accordance with claim 1 wherein the first output of the first and the second means for amplifying further comprises a RF output.

5. A transmitter in accordance with claim 1 wherein said means for shifting voltage further comprises a transistor with an intrinsic voltage drop of 0.7 volts.

6. A transmitter in accordance with claim 1 wherein said means for shifting voltage further comprises a diode.

7. A transmitter in accordance with claim 1 wherein said means for coupling further comprises the first output of the first means for amplifying coupled to the first input of the second means for amplifying.

* * * * *